United States Patent [19]
Lee et al.

[11] Patent Number: 5,590,079
[45] Date of Patent: Dec. 31, 1996

[54] WAFER BURN-IN TEST CIRCUIT OF A SEMICONDUCTOR MEMORY DEVICE

[75] Inventors: Jae-Hyeong Lee, Seoul; Yong-sik Seok, Suwon, both of Rep. of Korea

[73] Assignee: Samsung Electronics Co., Ltd., Suwon, Rep. of Korea

[21] Appl. No.: 474,158

[22] Filed: Jun. 7, 1995

[30]    Foreign Application Priority Data

Jun. 8, 1994  [KR]  Rep. of Korea ................... 12847/1994

[51] Int. Cl.$^6$ ........................................................ G11C 7/00
[52] U.S. Cl. ................ 365/201; 365/189.11; 365/230.06
[58] Field of Search .............................. 365/201, 189.07, 365/189.09, 193, 236, 230.06, 189.11

[56]    References Cited

U.S. PATENT DOCUMENTS

| | | | |
|---|---|---|---|
| 5,363,333 | 11/1994 | Tsujimoto | 365/201 |
| 5,381,373 | 1/1995 | Ohsawa | 365/201 |
| 5,452,253 | 9/1995 | Choi | 365/201 |

OTHER PUBLICATIONS

Furuyama, Tohru et al., Wafer Burn–in (WBI) Technology for RAM's, Toshiba Corp & Toshiba Microelectronics Corp, No month available 1993 IEEE, IEDM 93–639—IEDM 93–642.

*Primary Examiner*—Son T. Dinh
*Attorney, Agent, or Firm*—Cushman Darby & Cushman IP Group of Pillsbury Madison & Sutro LLP

[57]    ABSTRACT

A wafer burn-in test circuit for sensing a defective cell of a semiconductor memory device having a plurality of memory cells connected to a word line and a row decoder for selecting the word line. The burn-in test includes a word line driver circuit having an input coupled to a row decoding signal generated by the row decoder, and an ouput coupled to the word line, a control circuit having a first input coupled to a burn-in voltage signal, and a second input coupled to a control signal, and an electrical line connected between the word line driver circuit and the control circuit. In a normal mode of operation, the word line driver circuit is responsive to the row decoding signal for raising the word line to an enable voltage level. In a burn-in test mode of operation, the control circuit is responsive to the control signal for applying a burn-in voltage to the word line via the electrical line and the word line driver circuit.

20 Claims, 4 Drawing Sheets

WAFER BURN-IN TEST CIRCUIT OF A SEMICONDUCTOR MEMORY DEVICE

BACKGROUND OF THE INVENTION

1. Field of the Invention

The present invention relates generally to semiconductor memory devices, and, more particularly, to a wafer burn-in test circuit for sensing a defective memory cell of a semiconductor memory device.

2. Description of Related Art

Generally, a burn-in test for ensuring the reliability of a semiconductor memory chip is performed after wafer fabrication is completed, and more specifically, after the chip has already been assembled and packaged. Chips which are found to be defective are discarded. Since the defective chips are screened out after the assembly and packaging processes have been completed, a significant amount of time and money is wasted.

In dynamic random access memories (DRAMs), the time required to test for defects is inordinately long, as most defects are single bit defects, usually associated with leakage current of an imperfect memory cell. The leakage current is usually caused by defects in the transfer gate oxide layer, capacitor dielectric layer, storage node junction, or the like.

In a conventional burn-in test, the efficiency at which a stress voltage is supplied to a memory cell is very low due to the fact that only one word line is selected per few thousand cycles (e.g., every 4,096 or 8,192 cycles in the case of a 64 Mb DRAM). Of course, this problem is exacerbated by the ever-increasing packing densities of semiconductor memory devices. In this regard, in order to reduce burn-in time and raise the efficiency at which the stress voltage is supplied, a burn-in technique in which all the word lines are simultaneously selected has been adopted. Such a technique is disclosed in detail in an article entitled "Wafer Burn-in (WBI) Technology for DRAMs", IEDM, 1993, pp. 639–642.

With reference now to FIG. 1, a conventional burn-in test circuit will now be described. More particularly, a typical memory cell array includes word lines WL0–WLn connected to a word line driver 6 and to the gate electrode of respective transfer transistors 2, and complementary bit lines BL and/BL connected to a sense amplifier 8. Data stored in storage capacitors 4 are transferred to the bit lines BL and /BL through respective ones of the transfer transistors 2. Each associated transfer transistor 2 and storage capacitor 4 pair constitutes a memory cell.

The conventional burn-in test circuit includes a plurality of transistors 10 connected between respective ones of the word lines WL0–WLn and a gate electrode voltage (Vg) line. The transistors 10 each have a small-sized channel. In operation, a burn-in test is performed by simultaneously applying a stress voltage Vstress to the gate electrodes of all of the transistors 10, and then simultaneously applying a gate electrode voltage Vg to the gate electrodes of the transfer transistors 2, via the small-sized channels of the transistors 10. A stress voltage of a desired level can be supplied to the dielectric layer and storage node junction of the capacitors 4 by appropriately controlling a plate voltage VPL applied to the storage plate electrode of the capacitors 4, and a voltage applied to the bit lines BL and/BL, from the exterior of the chip. In this manner, a wafer burn-in test circuit supplies a high stress voltage to the gate electrode of the transfer transistors 2 so that even a small leakage current (evidencing a defective memory cell) can be sensed.

With reference now to FIG. 2, a word line structure of a low integration density DRAM (e.g., a 16 Mb DRAM) has a sufficient word line pitch to enable a metal strap having a low resistance to be strapped to a gate polysilicon having a higher resistance, to thereby enhance the on/off characteristics of the word lines. With this word line structure, the wafer burn-in test circuit depicted in FIG. 1 can perform satisfactorily.

With reference now to FIG. 3, a word line structure of a high integration density DRAM (e.g., a 64 Mb DRAM) has a much narrower word line pitch and much smaller memory cells, thereby rendering it exceedingly difficult to strap metal to all of the polysilicon word lines, thus necessitating a split word line driver (SWD) structure. Since the split word line driver requires only one metal line per 4–8 word lines, it is excellent from the standpoint of providing a sufficient metal pitch. However, due to the split word line structure, it is difficult to supply a stress voltage to the memory cells via transistors having a small channel size, such as in the conventional wafer burn-in test circuit depicted in FIG. 1.

Based on the above, it can be appreciated that there presently exists a need in the art for a burn-in test circuit for a semiconductor memory device which overcomes the drawbacks and shortcomings of the presently available technology. The present invention fulfills this need.

SUMMARY OF THE INVENTION

The present invention encompasses a wafer burn-in test circuit for sensing a defective cell of a semiconductor memory device having a plurality of memory cells connected to a word line and a row decoder for selecting the word line. The burn-in test includes a word line driver circuit having an input coupled to a row decoding signal generated by the row decoder, and an ouput coupled to the word line, a control circuit having a first input coupled to a burn-in voltage signal, and a second input coupled to a control signal, and an electrical line connected between the word line driver circuit and the control circuit.

In a normal mode of operation, the word line driver circuit is responsive to the row decoding signal for raising the word line to an enable voltage level.

In a burn-in test mode of operation, the control circuit is responsive to the control signal for applying a burn-in voltage to the word line via the electrical line and the word line driver circuit.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
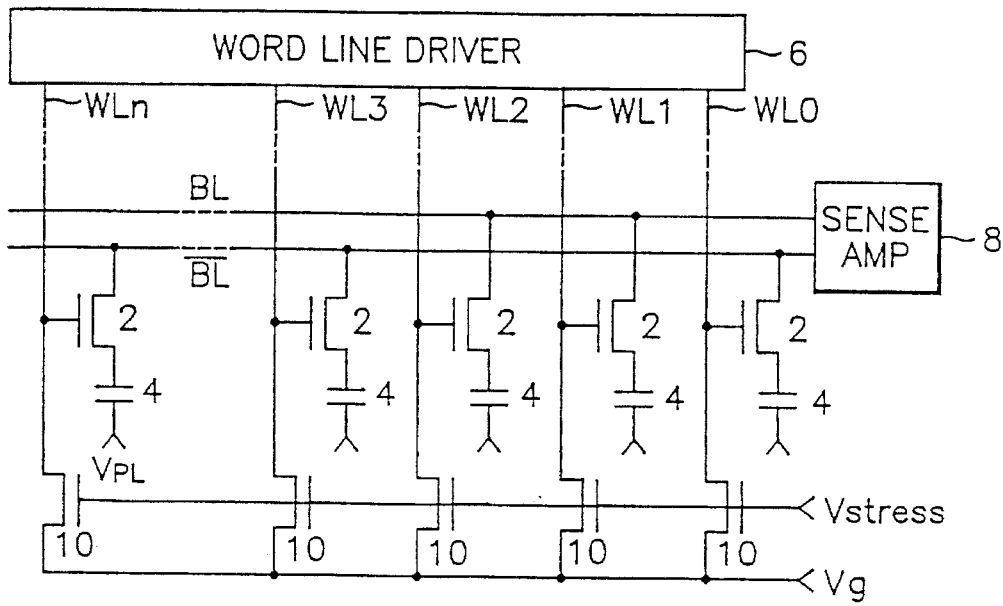
FIG. 1 is a diagram of a conventional wafer burn-in test circuit.
Figure 2:
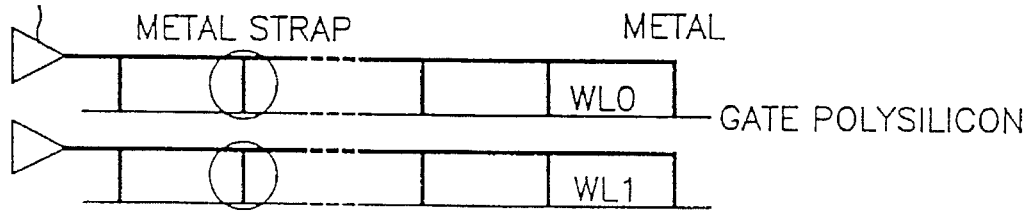
FIG. 2 is a diagram of the word line structure of a low integration density DRAM.
Figure 3:
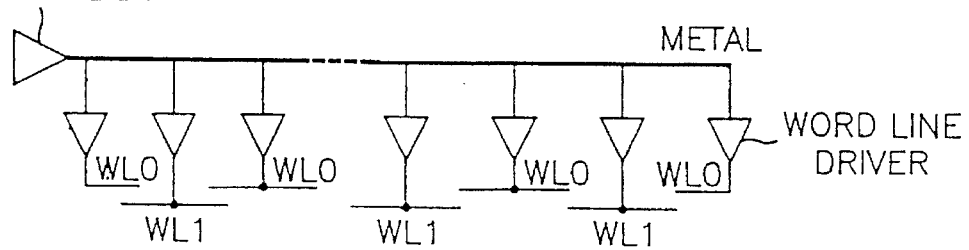
FIG. 3 is a diagram of the word line structure of a high integration density DRAM.
Figure 4:
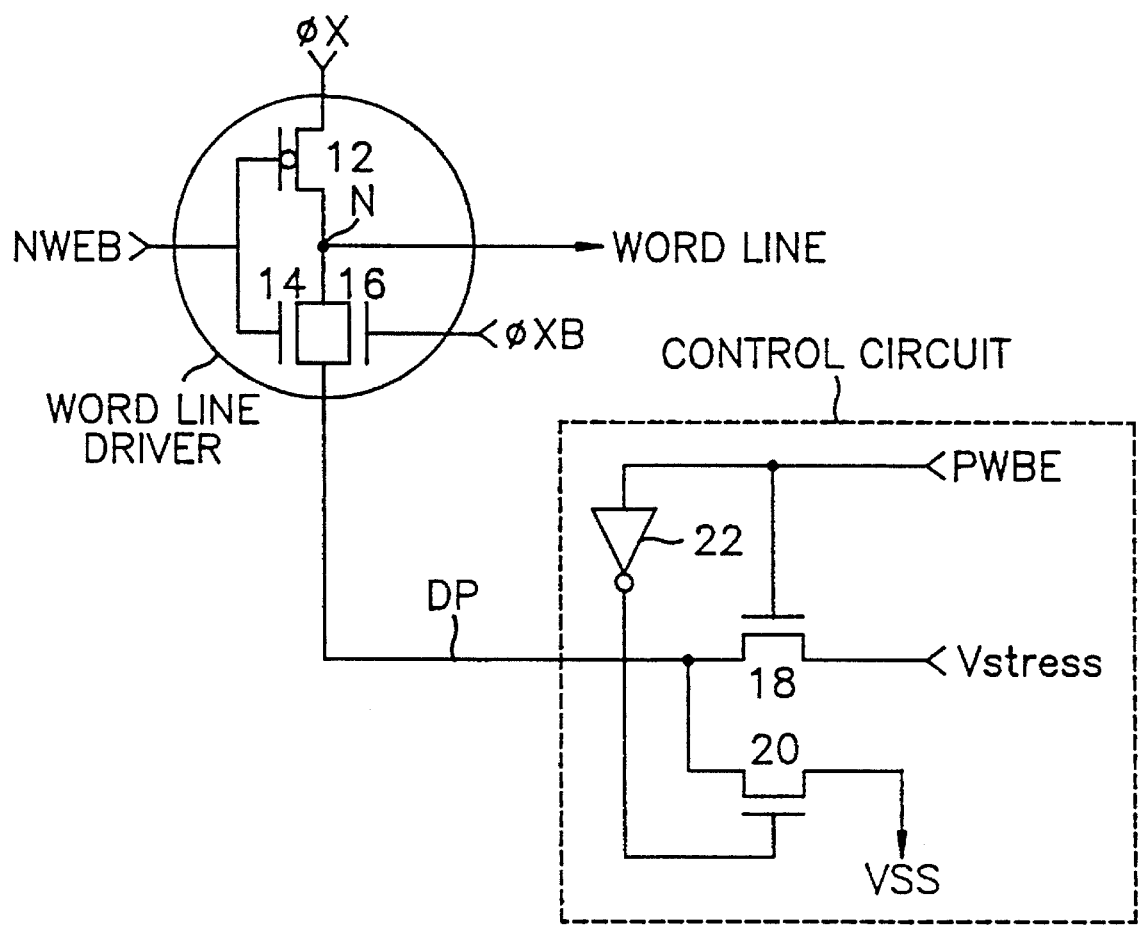
FIG. 4 is a schematic diagram of a wafer burn-in test circuit constructed in accordance with a preferred embodiment of the present invention.

With reference now to FIG. 4, a wafer burn-in test circuit constructed in accordance with a preferred embodiment of the present invention will now be described. More particularly, the wafer burn-in test circuit depicted in FIG. 4 includes a word line driver and a control circuit interconnected via a word line discharge path line DP.

The word line driver includes a PMOS transistor 12 and a pair of current pass NMOS transistors 14, 16, connected in series between a word line boosting voltage ØX and the word line discharge path line DP. The gate electrodes of the PMOS transistor 12 and the NMOS transistor 14 are commonly coupled to a row decoding signal NWEB. The drain electrodes of the NMOS transistors 14, 16 are commonly connected to the drain electrode of the PMOS transistor 12. An output node N intermediate the PMOS transistor 12 and the NMOS transistors 14, 16 is coupled to a word line. The gate electrode of the NMOS transistor 16 is coupled to a voltage ØXB which is complementary to the word line boosting signal ØX. The source electrodes of the NMOS transistors 14, 16 are commonly connected to the word line discharge path line DP.

The control circuit includes a burn-in control NMOS transistor 18, an inverter 22, and a discharge NMOS transistor 20. The channel of the burn-in control NMOS transistor 18 is connected between a stress voltage Vstress and the word line discharge path line DP. The gate electrode of the burn-in control NMOS transistor 18 is coupled to a wafer burn-in enable signal PWBE. The inverter 22 inverts the wafer burn-in enable signal PWBE. The channel of the discharge NMOS transistor 20 is connected between the word line discharge path line DP and a reference potential Vss, e.g., ground. The gate electrode of the discharge NMOS transistor 20 is connected to the output of the inverter 22, which is the inverted wafer burn-in signal.

Although the wafer burn-in test circuit depicted in FIG. 4 includes a current pass means comprised of both an NMOS transistor 14 and an NMOS transistor 16, it should be recognized that the wafer burn-in test circuit of the present invention can be implemented with a current pass means comprised of only the NMOS transistor 14. The NMOS transistor 16 is preferably provided to increase the current driving capacity of the current pass means.

With continuing reference to FIG. 4, the operation of the wafer burn-in test circuit of the present invention will now be described.

In a normal mode of operation, the wafer burn-in enable signal PWBE and the row decoding signal NWEB are both maintained at a logic low level, and the word line boosting voltage ØX is maintained at a logic high level of Vpp. Under these conditions, the word line boosting voltage input PMOS transistor 12 is turned on, the pair of current pass NMOS transistors 14, 16 are turned off, the burn-in control NMOS transistor 18 is turned off, and the discharge NMOS transistor 20 is turned on. Accordingly, the source electrodes of the current pass NMOS transistors 14, 16 are connected to Vss via the word line discharge path line DP and the turned-on discharge NMOS transistor 20. Since the PMOS transistor 12 is turned on, the output node N is pulled up to the word line boosting voltage ØX, and the corresponding word line is enabled.

In a stand-by mode of operation, the wafer burn-in enable signal PWBE is maintained at a logic low level, the row decoding signal NWEB is maintained at a logic high level, and the word line boosting voltage ØX is maintained at a logic low level. Under these conditions, the word line boosting voltage input PMOS transistor 12 is turned off and the current pass NMOS transistors 14, 16 are turned on. The output node N is discharged to Vss via the word line discharge path line DP and the turned-on discharge NMOS transistor 20, thereby disabling the corresponding word line.

In a burn-in test mode of operation, the wafer burn-in enable signal PWBE is driven to a logic high level, thereby turning off the discharge NMOS transistor 20, and turning on the burn-in control NMOS transistor 18. The row decoding signal NWEB is maintained at a logic high level, whereby the current pass NMOS transistors 14, 16 are turned-on. As such, the stress voltage Vstress is applied via the turned-on burn-in control NMOS transistor 8, the word line discharge path line DP, and the turned-on current pass NMOS transistors 14, 16, to the output node N and the corresponding word line. In this manner, a burn-in test of the memory cells (not shown) connected to the word line can be performed.

in the prior art, an additional transistor is connected between a stress voltage and each of the word lines, thereby limiting the utility of the wafer burn-in test circuit in highly integrated semiconductor memory devices. By contrast, with the burn-in test circuit of the present invention depicted in FIG. 4, the transistors of the word line driver circuit and control circuit are used in both the normal and burn-in test modes of operation, thereby eliminating the necessity of the additional transistors required by the prior art. Consequently, the burn-in test circuit of the present invention can be effectively used in highly integrated semiconductor memory devices having very fine pitch word line structures for performing effective burn-in tests with a suitable stress voltage. The stress voltage Vstress and the wafer burn-in enable signal PWBE can be easily controlled via a dummy pad (not shown) provided in the interior of the memory chip (not shown) in which the wafer burn-in test circuit of the present invention is utilized.

Figure 5:
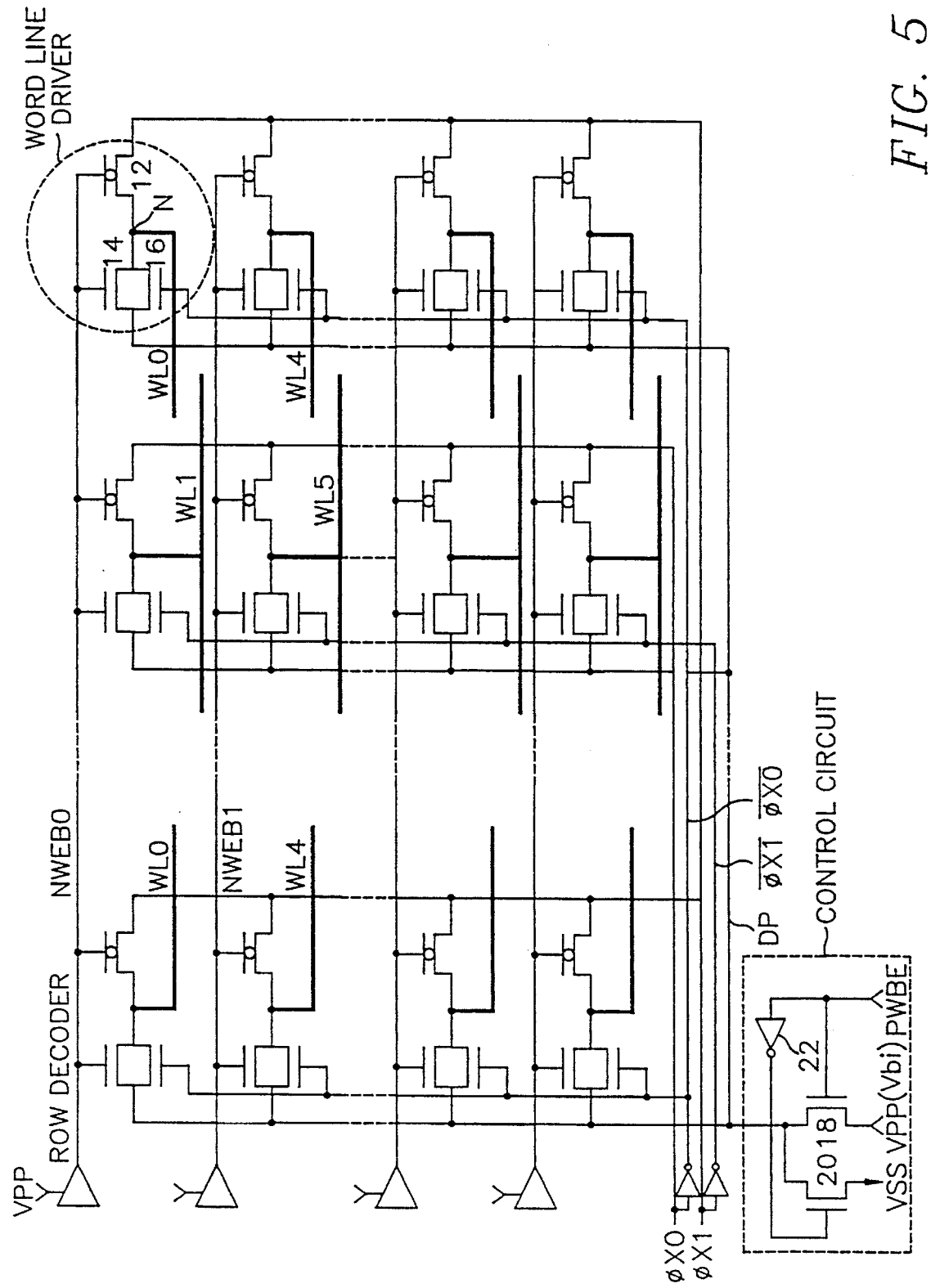
FIG. 5 is a schematic diagram of a portion of a semiconductor memory device incorporating the wafer burn-in test circuit depicted in FIG. 4; and, FIG. 6 is a timing diagram illustrating the operation of the circuitry depicted in FIG. 5.

With reference now to FIG. 5, there can be seen a schematic diagram of a portion of a semiconductor memory device incorporating the burn-in test circuit of the present invention. More particularly, the semiconductor memory device includes a plurality of word line drivers for driving respective word lines of the device, and a control circuit for controlling the plurality of word line drivers. The control circuit and each of the word line drivers are of the same construction as depicted in FIG. 4.

Figure 6:
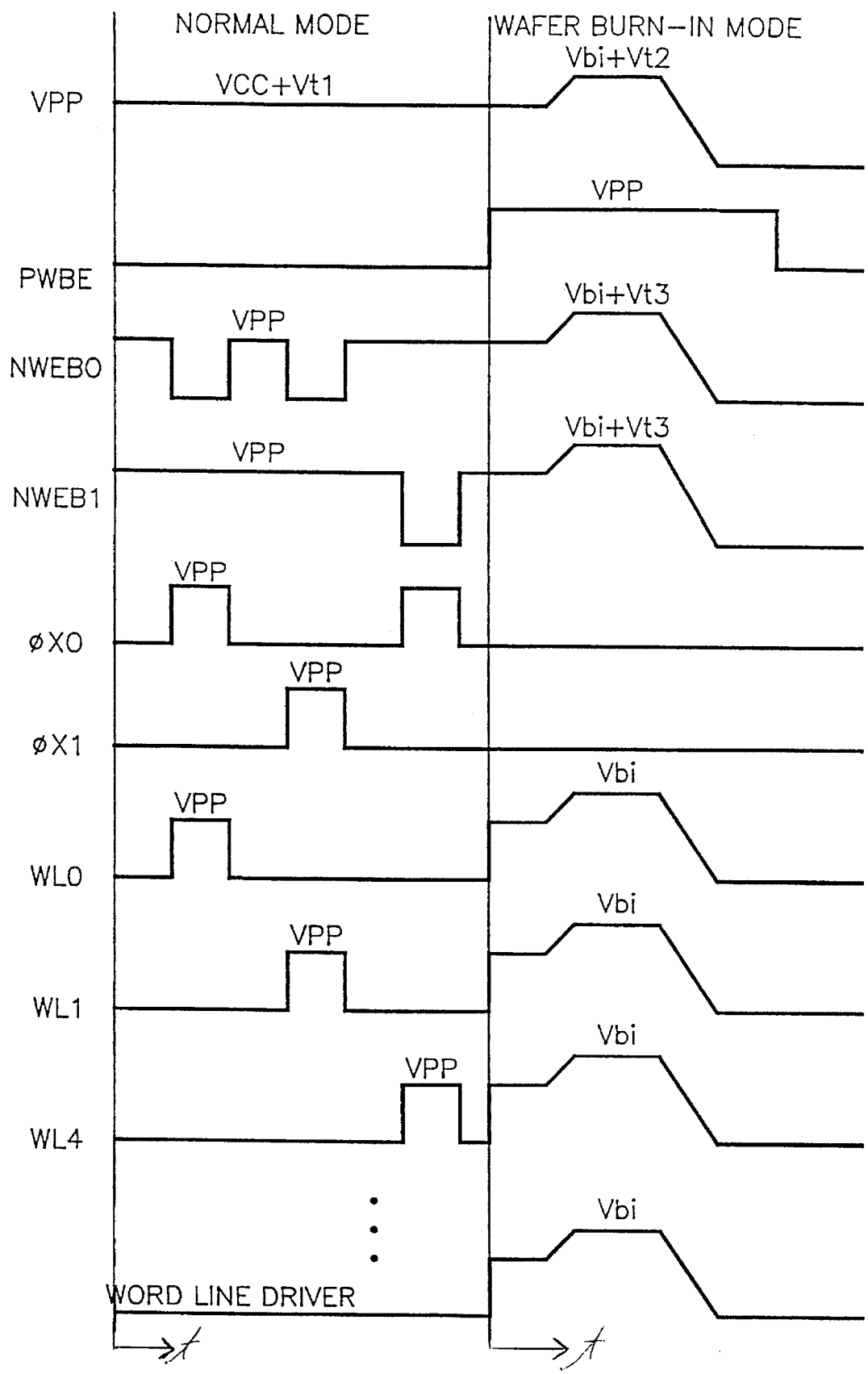

The operation of the wafer burn-in test circuit of the memory device depicted in FIG. 5 will now be described in relation to the word line driver circumscribed by the dotted circle, with additional reference being made to the timing diagram of FIG. 6. In a normal mode of operation, the wafer burn-in enable signal PWBE and the row decoding signal NWEB0 are both maintained at a logic low level, the word line boosting voltage ØX0 is maintained at a logic high level of Vpp, and ØX1 is maintained at a logic low level. The word line boosting voltage Vpp is also preferably applied to an input terminal of the control circuit. Under these conditions, the word line boosting voltage input PMOS transistor 12 of the encircled word line driver is turned on, the pair of current pass NMOS transistors 14, 16 thereof are turned off, the burn-in control NMOS transistor 18 of the control circuit is turned off, and the discharge NMOS transistor 20 is turned on. Consequently, the source electrodes of the current pass NMOS transistors 14, 16 are connected to Vss via the word line discharge path line DP and the discharge NMOS transistor 20. Since the PMOS transistor 12 is turned on, the output node N of the encircled word line driver circuit is pulled up to the word line boosting voltage ØX1, and the corresponding word line WL0 is enabled.

As will be appreciated by those skilled in the art, the boosting voltage Vpp is preferably at least higher than a chip supply voltage Vcc by an amount Vt1, which is the threshold voltage of the transfer transistor of the memory cells connected to the word lines. As will also be appreciated by those skilled in the art, the methodology for enabling other ones of the word lines (e.g., the word lines WL1, WL4, WL5) of the memory device is the same as that described above for enabling the word line WL0.

In a wafer burn-in test mode of operation, the wafer burn-in enable signal PWBE is driven to a logic high level, e.g., Vpp, and the row decoding signal NWEBi (where $i=0-n$) is driven to a logic high voltage level of Vbi+Vt3, where Vbi is the burn-in voltage (or stress voltage) and Vt3 is the threshold voltage of the current pass NMOS transistors 14 and 16. Under these conditions, the burn-in control NMOS transistor 18 is turned on, the discharge NMOS transistor 20 is turned off, the word line boosting voltage input PMOS transistor 12 is turned off, and the current pass NMOS transistors 14, 16 are turned on. The stress voltage applied via the turned-on burn-in control NMOS transistor 18 and the current pass NMOS transistors 14, 16 to the output node N and the corresponding word line WL0 (or, more generally, WLi) is Vbi−Vt2, where Vt2 is the threshold voltage of the burn-in control NMOS transistor 18. Preferably, Vbi is at least Vpp+Vt2, so that the desired stress or burn-in voltage Vbi can be supplied to the memory cells (not shown) connected to the selected word line WLi, to thereby enable performance of an effective wafer burn-in test of the memory device.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A burn-in test circuit for sensing a defective cell of a semiconductor memory device having a plurality of memory cells connected to a word line and a row decoder for selecting the word line, said burn-in test circuit comprising:

a word line driver circuit having an input coupled to receive a row decoding signal generated by the row decoder, and an output node coupled to the word line, said row decoding signal having a first state during a normal mode of operation and a second state different than said first state during a burn-in test mode of operation, said word line driver circuit including:

a word line boosting voltage transferring circuit coupled to receive an enable voltage and to said output node and being controlled by said row decoding signal, said word line boosting voltage transferring circuit being responsive to said row decoding signal in said normal mode of operation to raise said word line to a voltage level of said enable voltage, and a current pass circuit coupled between said output node and a discharge node and being controlled by said row decoding signal, said current pass circuit being responsive to said row decoding signal in said burn-in test mode of operation to connect said word line to said discharge node;

a control circuit having a first input coupled to receive a burn-in voltage, and a second input coupled to receive a control signal; and an electrical line connected between said discharge node of said word line driver circuit and said control circuit said control circuit being responsive to said control signal in said burn-in test mode of operation to apply said burn-in voltage to the word line via said electrical line and said current pass circuit of said word line driver circuit.

2. The burn-in test circuit as set forth in claim 1, wherein:

said word line boosting voltage transferring circuit comprises an input transistor having a first electrode coupled to receive said enable voltage, a gate electrode coupled to receive said row decoding signal, and a second electrode;

said current pass circuit comprises a current pass transistor having a first electrode coupled to said second electrode of said input transistor, a gate electrode coupled to receive said row decoding signal, and a second electrode coupled to said electrical line; and, wherein said output node of said word line driver circuit is intermediate said input transistor and said current pass transistor.

3. The burn-in test circuit as set forth in claim 1, wherein:

said word line boosting voltage transferring circuit comprises an input transistor having a first electrode coupled to receive said enable voltage, a gate electrode coupled to receive said row decoding signal, and a second electrode;

said current pass circuit comprises a pair of current pass transistors each having a first electrode commonly coupled to said second electrode of said input transistor, and a second electrode commonly coupled to said electrical line;

wherein a first one of said current pass transistors has a gate electrode coupled to receive said row decoding signal, and a second one of said current pass transistors has a gate electrode coupled to receive a complement enable signal which is the logical inverse of said enable voltage; and, wherein said output node of said word line driver circuit is intermediate said input transistor and said current pass transistors.

4. The burn-in test circuit as set forth in claim 3, wherein said control circuit includes:

a burn-in control transistor having a first electrode coupled to said first input of said control circuit, a gate electrode coupled to said second input of said control circuit, and a second electrode coupled to said electrical line; and, a discharge transistor having a first electrode coupled to said electrical line, a gate electrode coupled to a complement control signal which is the logical inverse of said control signal, and a second electrode coupled to a reference potential.

5. The burn-in test circuit as set forth in claim 4, wherein:

in said normal mode of operation, said input transistor is turned on, said discharge transistor is turned on, said current pass transistors are turned off, and said burn-in control transistor is turned off; and, in said burn-in test mode of operation, said input transistor is turned off, said discharge transistor is turned off, said current pass transistors are turned on, and said burn-in control transistor is turned on.

6. The burn-in test circuit as set forth in claim 5, wherein said enable voltage comprises a word line boosting voltage.

7. The burn-in test circuit as set forth in claim 6, wherein said burn-in voltage is $\geq$ said word line boosting voltage.

8. The burn-in test circuit as set forth in claim 6, wherein said burn-in voltage is greater than said word line boosting voltage.

9. The burn-in test circuit as set forth in claim 1, wherein:

said enable voltage comprises a word line boosting voltage; and, said burn-in voltage is greater than said word line boosting voltage.

10. The burn-in test circuit as set forth in claim 1, wherein:

said enable voltage comprises a word line boosting voltage; and, said burn-in voltage is $\geq$ than said word line boosting voltage.

11. The burn-in test circuit as set forth in claim 5, wherein said current pass transistors, said burn-in control transistor, and said discharge transistor each comprise an NMOS transistor, and said input transistor comprises a PMOS transistor.

12. A burn-in test circuit for sensing a defective cell of a semiconductor memory device having a plurality of memory cells connected to a word line and a row decoder for selecting the word line, said burn-in test circuit comprising:

a word line driver circuit including word line boosting voltage input means and current pass means connected in series between a word line boosting voltage and an electrical line, said word line driver circuit having an output intermediate said word line boosting voltage input means and said current pass means, said output being coupled to the word line;

a control circuit including discharge means connected between said electrical line and a reference potential, and burn-in control means connected between said electrical line and a burn-in voltage;

wherein, in a normal mode of operation, said word line boosting voltage input means is turned on by said row decoding signal, said current pass means is turned off by said row decoding signal and a complement word line boosting voltage which is the logical inverse of said word line boosting voltage, said burn-in control means is turned off by a burn-in enable signal, and said discharge means is turned on by a complement burn-in enable signal which is the inverse of said burn-in enable signal, whereby said output and said word line are driven to said word line boosting voltage; and, wherein, in a burn-in test mode of operation, said word line boosting voltage input means is turned off by said row decoding signal, said current pass means is turned on by said row decoding signal said complement word line boosting voltage, said burn-in control means is turned on by said burn-in enable signal, and said discharge means is turned off by said complement burn-in enable signal, whereby said output and said word line are driven to said burn-in voltage.

13. The burn-in test circuit as set forth in claim 12, wherein said word line boosting voltage input means comprises a word line boosting voltage input transistor having a first electrode coupled to said word line boosting voltage, a gate electrode coupled to said row decoding signal, and a second electrode.

14. The burn-in test circuit as set forth in claim 13, wherein said current pass means comprises a pair of current pass transistors each having a first electrode commonly coupled to said second electrode of said word line boosting input transistor, and a second electrode commonly coupled to said electrical line, wherein a first one of said current pass transistors has a gate electrode coupled to said row decoding signal, and a second one of said current pass transistors has a gate electrode coupled to said complement word line boosting signal; and, wherein said output of said word line driver circuit is intermediate said word line boosting input transistor and said current pass transistors.

15. The burn-in test circuit as set forth in claim 14, wherein said burn-in control means includes a burn-in control transistor having a first electrode coupled to said burn-in voltage, a gate electrode coupled to said burn-in enable signal, and a second electrode coupled to said electrical line.

16. The burn-in test circuit as set forth in claim 15, wherein said discharge means includes a discharge transistor having a first electrode coupled to said electrical line, a gate electrode coupled to said complement burn-in enable signal, and a second electrode coupled to said reference potential.

17. The burn-in test circuit as set forth in claim 16, wherein said burn-in voltage is $\geq$ said word line boosting voltage.

18. The burn-in test circuit as set forth in claim 16, wherein said burn-in voltage is greater than said word line boosting voltage.

19. The burn-in test circuit as set forth in claim 12, wherein said burn-in voltage is greater than said word line boosting voltage.

20. The burn-in test circuit as set forth in claim 16, wherein said current pass transistors, said burn-in control transistor, and said discharge transistor each comprise an NMOS transistor, and said word line boosting voltage input transistor comprises a PMOS transistor.

\* \* \* \* \*